United States Patent
Chen et al.

(10) Patent No.: US 9,704,867 B2
(45) Date of Patent: Jul. 11, 2017

(54) DUAL FIN INTEGRATION FOR ELECTRON AND HOLE MOBILITY ENHANCEMENT

(71) Applicant: International Business Machines Corporation, Armonk, NY (US)

(72) Inventors: Chia-Yu Chen, Yorktown Heights, NY (US); Zuoguang Liu, Schenectady, NY (US); Miaomiao Wang, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/219,922

(22) Filed: Jul. 26, 2016

(65) Prior Publication Data

US 2016/0336322 A1 Nov. 17, 2016

Related U.S. Application Data

(62) Division of application No. 14/630,072, filed on Feb. 24, 2015, now Pat. No. 9,437,445.

(51) Int. Cl.
*H01L 27/092* (2006.01)
*H01L 29/66* (2006.01)
(Continued)

(52) U.S. Cl.
CPC ...... *H01L 27/0924* (2013.01); *H01L 21/0332* (2013.01); *H01L 21/0334* (2013.01);
(Continued)

(58) Field of Classification Search
None
See application file for complete search history.

(56) References Cited

U.S. PATENT DOCUMENTS

2012/0146101 A1* 6/2012 Lin ............... H01L 21/82380
257/255
2012/0228676 A1* 9/2012 Tan ............... H01L 29/7853
257/255

OTHER PUBLICATIONS

Chang, Leland, Meikei Ieong, and Min Yang. "CMOS Circuit Performance Enhancement by Surface Orientation Optimization." Simulation of Semiconductor Processes and Devices 2004 (2004): 57-60.*

(Continued)

*Primary Examiner* — Joseph Schoenholtz
(74) *Attorney, Agent, or Firm* — Cantor Colburn LLP; Vazken Alexanian

(57) ABSTRACT

A technique for forming a semiconductor device is provided. Sacrificial mandrels are formed over a hardmask layer on a semiconductor layer. Spacers are formed on sidewalls of the sacrificial mandrels. The sacrificial mandrels are removed to leave the spacers. A masking process leaves exposed a first set of spacers with a second set protected. In response to the masking process, a first fin etch process forms a first set of fins in the semiconductor layer via first set of spacers. The first set of fins has a vertical sidewall profile. Another masking process leaves exposed the second set of spacers with the first set of spacers and the first set of fins protected. In response to the other masking process, a second fin etch process forms a second set of fins in semiconductor layer using the second set of spacers. The second set of fins has a trapezoidal sidewall profile.

2 Claims, 17 Drawing Sheets

(51) Int. Cl.
| | |
|---|---|
| H01L 27/088 | (2006.01) |
| H01L 29/78 | (2006.01) |
| H01L 29/04 | (2006.01) |
| H01L 29/10 | (2006.01) |
| H01L 21/308 | (2006.01) |
| H01L 21/033 | (2006.01) |
| H01L 21/3065 | (2006.01) |
| H01L 21/8234 | (2006.01) |
| H01L 21/8238 | (2006.01) |
| H01L 21/306 | (2006.01) |

(52) U.S. Cl.
CPC ...... *H01L 21/3065* (2013.01); *H01L 21/3081* (2013.01); *H01L 21/3083* (2013.01); *H01L 21/3085* (2013.01); *H01L 21/3086* (2013.01); *H01L 21/30604* (2013.01); *H01L 21/823412* (2013.01); *H01L 21/823431* (2013.01); *H01L 21/823807* (2013.01); *H01L 21/823821* (2013.01); *H01L 27/0886* (2013.01); *H01L 29/6656* (2013.01); *H01L 29/66795* (2013.01); *H01L 29/7851* (2013.01); *H01L 29/7853* (2013.01); *H01L 29/7855* (2013.01); *H01L 29/045* (2013.01); *H01L 29/1033* (2013.01)

(56) References Cited

OTHER PUBLICATIONS

Chen, Chia-Yu, et al.; "Dual Fin Integration for Electron and Hole Mobility Enhancement"; U.S. Appl. No. 14/630,072, filed Feb. 24, 2015.

Chen, Chia-Yu, et al.; "Dual Fin Integration for Electron and Hole Mobility Enhancement"; U.S. Appl. No. 15/219,894, filed Jul. 26, 2016.

Chen, Chia-Yu, et al.; "Dual Fin Integration for Electron and Hole Mobility Enhancement"; U.S. Appl. No. 15/219,910, filed Jul. 26, 2016.

List of IBM Patents or Patent Applications Treated as Related—Date Filed: Aug. 2, 2016; 2 pages.

* cited by examiner

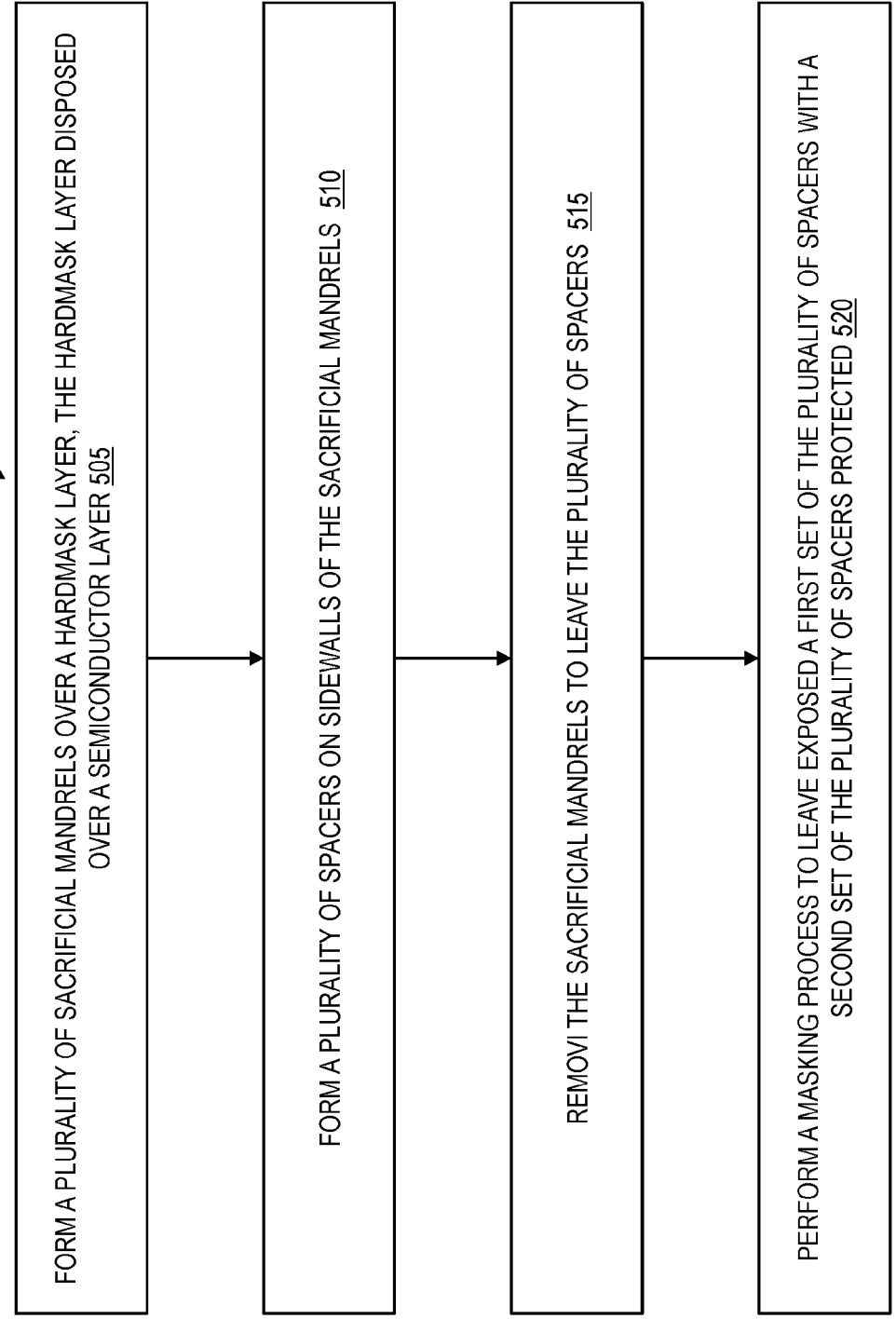

FIG. 5B 500

IN RESPONSE TO THE MASKING PROCESS, PERFORM A FIRST FIN ETCH PROCESS TO FORM A FIRST SET OF FINS IN THE SEMICONDUCTOR LAYER USING THE FIRST SET OF SPACERS, WHERE THE FIRST SET OF FINS HAS A VERTICAL SIDEWALL PROFILE 525

↓

PERFORM ANOTHER MASKING PROCESS TO LEAVE EXPOSED THE SECOND SET OF THE PLURALITY OF SPACERS WITH THE FIRST SET OF PLURALITY OF SPACERS AND THE FIRST SET OF FINS PROTECTED 530

↓

IN RESPONSE TO THE ANOTHER MASKING PROCESS, PERFORM A SECOND FIN ETCH PROCESS TO FORM A SECOND SET OF FINS IN THE SEMICONDUCTOR LAYER USING THE SECOND SET OF PLURALITY OF SPACERS, WHERE THE SECOND SET OF FINS HAS A TRAPEZOIDAL SIDEWALL PROFILE 535

PROVIDE NEGATIVE CHANNEL FIELD EFFECT TRANSISTORS (NFETS), WHERE THE NFETS HAVE TRAPEZOIDAL SHAPED FINS FOR A SOURCE AND A DRAIN  605

↓

PROVIDE POSITIVE CHANNEL FIELD EFFECT TRANSISTORS (PFETS), WHERE THE PFETS HAVE VERTICAL SHAPED FINS  610

↓

THE TRAPEZOIDAL SHAPED FINS HAVE A LARGER BASE THAT THE VERTICAL SHAPED FINS, AND THE TRAPEZOIDAL SHAPED FINS AND THE VERTICAL SHAPED FINS ARE TOGETHER ON THE SAME SUBSTRATE IN A MICROPROCESSOR  615

DUAL FIN INTEGRATION FOR ELECTRON AND HOLE MOBILITY ENHANCEMENT

DOMESTIC PRIORITY

This application is a divisional of and claims priority from U.S. patent application Ser. No. 14/630,072, filed on Feb. 24, 2015, entitled "DUAL FIN INTEGRATION FOR ELECTRON AND HOLY MOBILITY ENHANCEMENT", the entire contents of which are incorporated herein by reference.

BACKGROUND

The present disclosure relates generally to electron and hole mobility in integrated circuit device manufacturing, and more specifically to dual fin integration for electron and hole mobility enhancement.

In solid-state physics, the electron mobility characterizes how quickly an electron can move through a metal or semiconductor, when pulled by an electric field. In semiconductors, there is an analogous quantity for holes, called hole mobility. The term carrier mobility refers in general to both electron and hole mobility in semiconductors.

Electron and hole mobility are special cases of electrical mobility of charged particles under an applied electric field. For example, when an electric field E is applied across a piece of material, the electrons respond by moving with an average velocity called the drift velocity.

Conductivity is proportional to the product of mobility and carrier concentration. For example, the same conductivity could come from a small number of electrons with high mobility for each, or a large number of electrons with a small mobility for each. For semiconductors, the behavior of transistors and other devices can be very different depending on whether there are many electrons with low mobility or few electrons with high mobility. Therefore, mobility is a very important parameter for semiconductor materials. Almost always, higher mobility leads to better device performance, with other things being equal.

BRIEF SUMMARY

Embodiments include a method of forming a semiconductor device. The method includes forming a plurality of sacrificial mandrels over a hardmask layer, in which the hardmask layer is disposed over a semiconductor layer, forming a plurality of spacers on sidewalls of the plurality of sacrificial mandrels, removing the plurality of sacrificial mandrels to leave the plurality of spacers, and performing a masking process to leave exposed a first set of the plurality of spacers with a second set of the plurality of spacers protected. In response to the masking process, a first fin etch process is performed to form a first set of fins in the semiconductor layer using the first set of the plurality of spacers, where the first set of fins has a vertical sidewall profile. Another masking process is performed to leave exposed the second set of the plurality of spacers with the first set of the plurality of spacers and the first set of fins protected. In response to the other masking process, a second fin etch process is performed to form a second set of fins in the semiconductor layer using the second set of the plurality of spacers, where the second set of fins has a trapezoidal sidewall profile.

Embodiments include a method of forming a semiconductor device. The method includes forming trapezoidal shaped fins on a substrate, where a trapezoidal shape of the trapezoidal shaped fins enhances electron mobility, and forming vertical shaped fins on the substrate. A straight vertical shape of the vertical shaped fins enhances hole mobility, and the trapezoidal shaped fins have a larger base that the vertical shaped fins. An integrated circuit is formed by the trapezoidal shaped fins and the vertical shaped fins.

Embodiments include a semiconductor device. Trapezoidal shaped fins are formed on a substrate, where a trapezoidal shape of the trapezoidal shaped fins enhances electron mobility. Vertical shaped fins are formed on the substrate, where a straight vertical shape of the vertical shaped fins enhances hole mobility. The trapezoidal shaped fins have a larger base that the vertical shaped fins. The trapezoidal shaped fins and the vertical shaped fins are formed together as components in an integrated circuit.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIGS. 3A though 3J together illustrate a process flow of fabricating a dual fin integration structure for electron and hole mobility enhancement according to an embodiment, in which:

FIG. 3A illustrates a layer of fin material layer deposited on substrate, and a fin hardmask deposited on the fin material, along with spacers and sacrificial layers deposited on the fin hardmask;

FIGS. 5A and 5B illustrate a method of forming a semiconductor device with dual fin integration for electron and hole mobility enhancement, according to an embodiment;

FIG. 6 illustrates a method of forming a semiconductor device with dual fin integration for electron and hole mobility enhancement according to an embodiment.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

While the planar field effect transistor (FET) may appear to have reached the end of its scalable lifespan, the semiconductor industry has found an alternative approach with FinFETs. FinFET technology is viewed by many as the best choice for next generation advanced processes.

Figure 1:
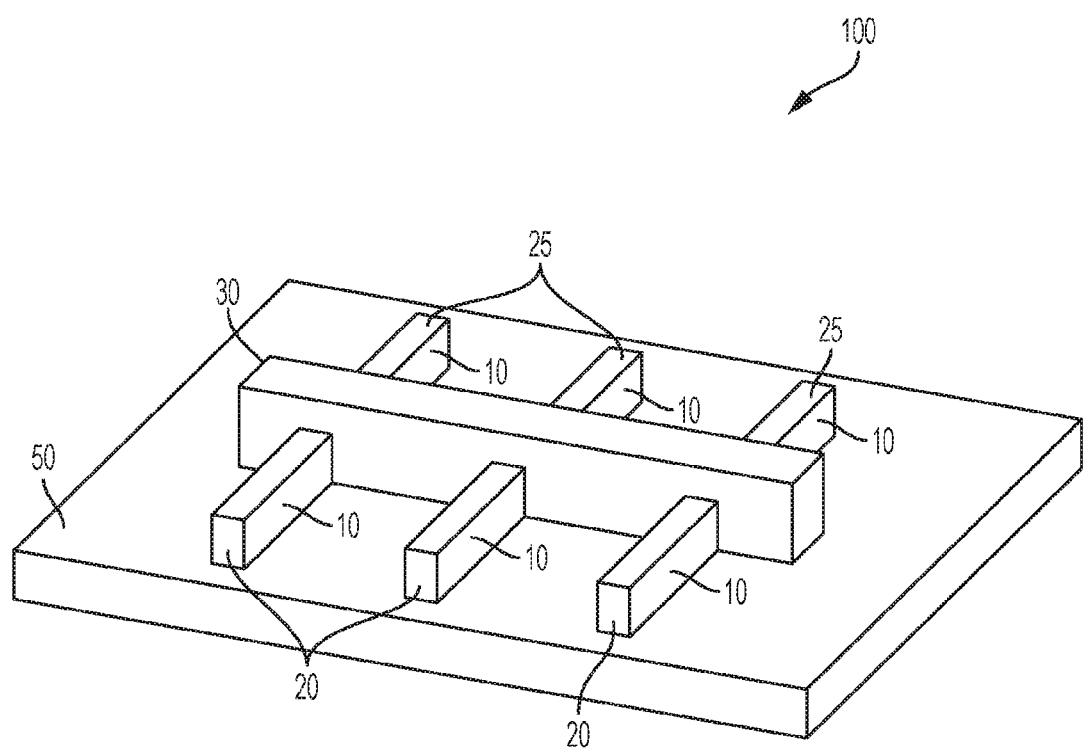
FIG. 1 illustrates an example of a fin field effect transistor (FinFET) device.

With advanced geometry planar FET technologies, such as 20 nanometer (nm), the source and the drain encroach into the channel, making it easier for leakage current to flow between them and making it very difficult to turn the transistor off completely. FinFETs are three-dimensional structures that rise above the substrate and resemble a fin, hence the name. FIG. 1 illustrates one example of a FinFET device 100. The fins 10 may be formed on the substrate 50. The fins 10 form the source 20 and drain 25 (on opposite ends), effectively providing more volume than a planar transistor for the same area. The gate 30 wraps around the fin 10, providing better control of the channel and allowing very little current to leak through the body when the device is in the "off" state. This, in turn, enables the use of lower threshold voltages and results in better performance and power as compared to a planar transistor.

Figure 2:
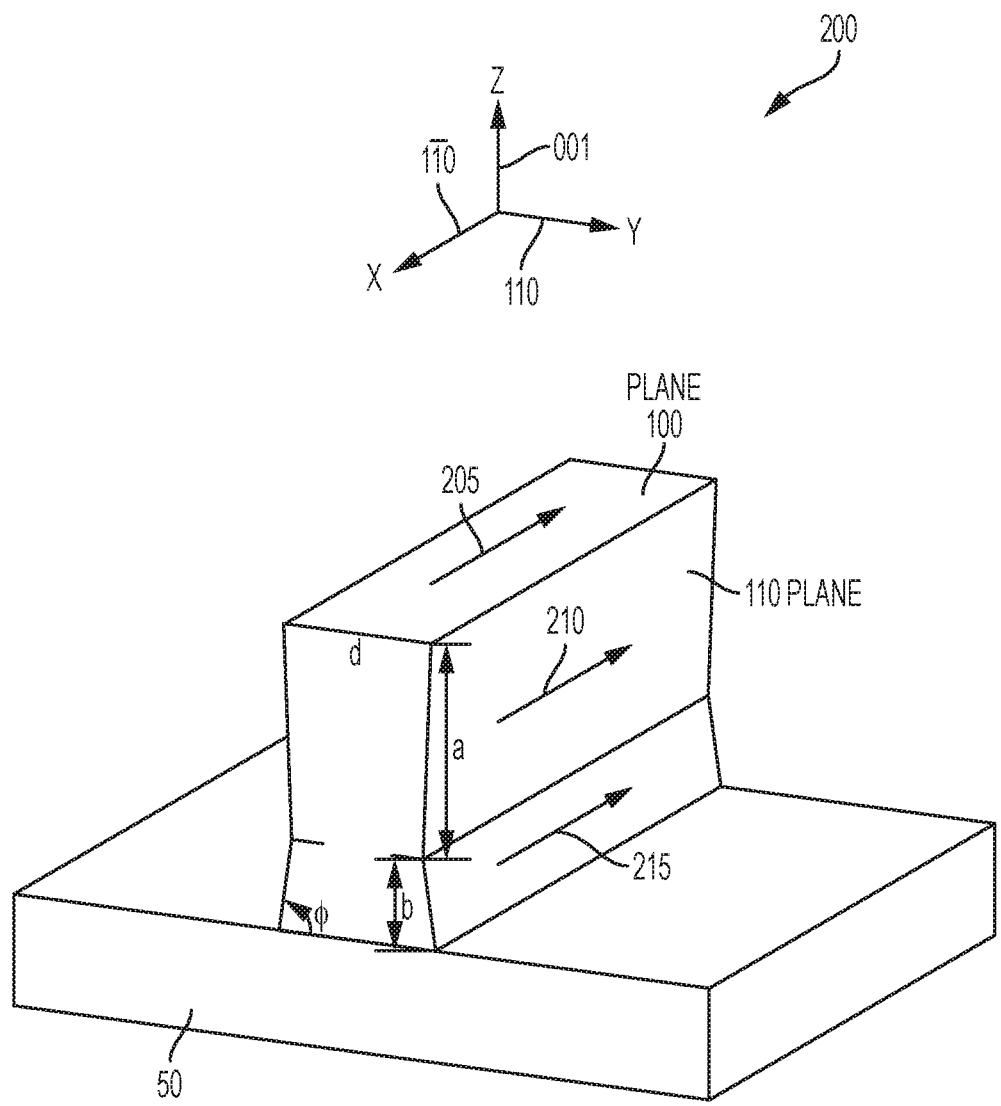
FIG. 2 illustrates an example fin structure.

FIG. 2 illustrates an example fin structure 200. In FinFET, the height (z direction) of the fin (HFin) is a great knob (variable) for the increase of total effect current (Ieff) per inch because Weff=2HFin+DFin. DFin is the width in the y direction. Weff is the effective channel width. For explanation purposes, it is assumed that the electrical current moves in the directions of arrows 205, 210, 215 (e.g., in the x direction), although electrons and holes (absence of electrons) may move in opposite directions. The electrical current flows along the outer surface of the fin 200.

Fin orientation is very germane because carrier mobilities are generally anisotropic (not the same in every direction). For example, electron mobility is highest in the (100) plane ((100) plane is equal to (001) plane). The (100) plane (i.e., x-y plane) has electrical current arrow 205 within the −x direction. The electron mobility (flow of electrical current) is highest in the (100) plane represented as flowing in the electrical current arrow 205, while hole mobility is lowest. The (100) plane (x-y plane) is the top surface with width "d" in the fin 200.

Conversely, hole mobility is largest in the (110) plane, while electron mobility is lowest. The (110) plane (i.e., x-z plane) has electrical current 210 in the −x direction. The hole mobility (flow of electrical current) is highest in the (110) plane represented as flowing in the electrical current arrow 210. The (110) plane (x-z plane) is the vertical sidewall with height "a" in the fin 200.

Also, the fin structure 200 has an angled foot at the base. The angled foot extends out at angle ϕ. The angled foot creates a transition plane that shows electrical current arrow 215. In the transition plane of the angled foot, the electron mobility and hole mobility are neither the highest nor the lowest but in between.

In a silicon-on-insulator (SOI) FinFET, the (110) plane is usually used as the substrate to enhance the hole mobility as the electron mobility is intrinsically greater than hole mobility. Electrons are the majority carrier in a negative channel field effect transistor (NFET), while holes are the majority carrier in a positive channel field effect transistor (PFET). When determining the size of a fin, there is a trade-off between a fin with increased hole mobility versus increased electron mobility.

Figure 3A:
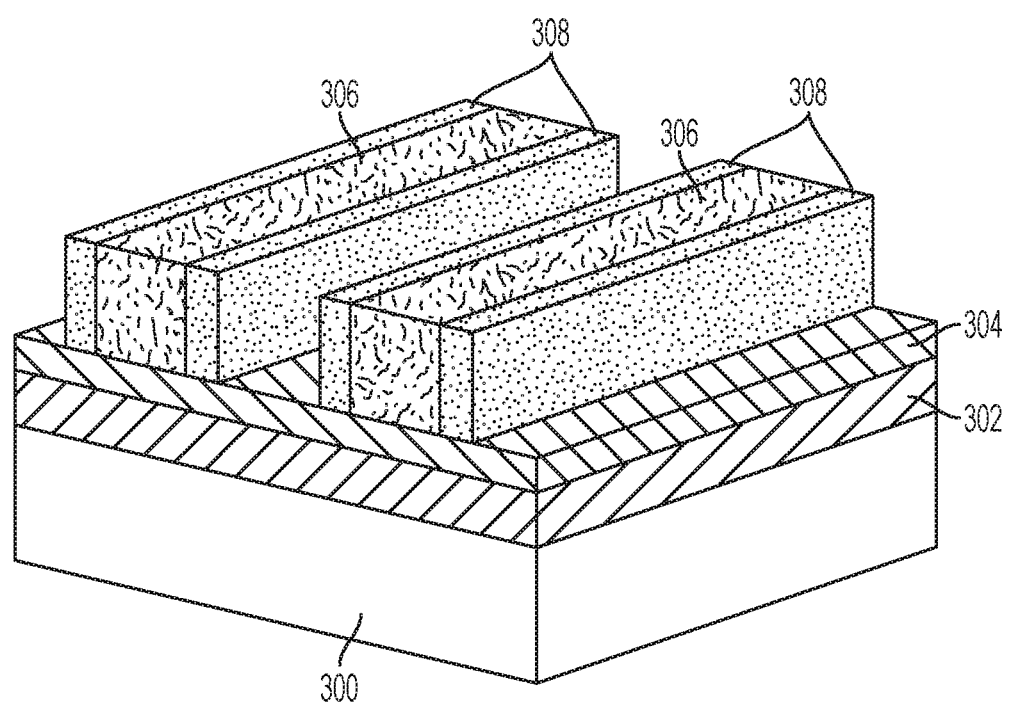

According to an embodiment, a novel dual fin profile integration is disclosed to make beneficial use of both electron and hole mobility favored planes. FIGS. 3A though 3J together illustrate a process flow of fabricating a dual fin integration structure for electron and hole mobility enhancement according to an embodiment. FIG. 3A illustrates a substrate 300 with a layer of fin material layer 302 deposited on the substrate 300. A fin hardmask 304 is deposited on the fin material 302.

In order to prepare to pattern the (future) fins and define the pitch of the fins, spacer lithography is performed. Spacer lithography may include sidewall image transfer (SIT). Blocks of sacrificial layers 306 (mandrel) are formed by layer deposition, pattering and etching, and spacers 308 (SIT spacers) are formed on sidewall surfaces of the mandrels 306. The spacer layer 308 may be formed, for example, by blanket deposition on the hardmask 304 and mandrels 306, followed by anisotropic (directional) etching to remove horizontally disposed surface of the spacer layer material.

The substrate 300 may be a material such as an insulator. The fin material 302 may be silicon, germanium, etc. The thickness of the fin material 302 determines the height of the fin (being fabricated). The fin hardmask 304 may be an oxide, such as silicon dioxide or germanium oxide. Also, the fin hardmask 304 may be a nitride. The spacer 308 can be a nitride when the fin hardmask 304 is an oxide, and the spacer 308 can be an oxide when the fin hardmask 304 is a nitride. The sacrificial layer 306 may be a polysilicon material. The width of the spacer 308 determines the width of the fin (being fabricated for vertical fins and the top width for tapered fins).

Figure 3B:
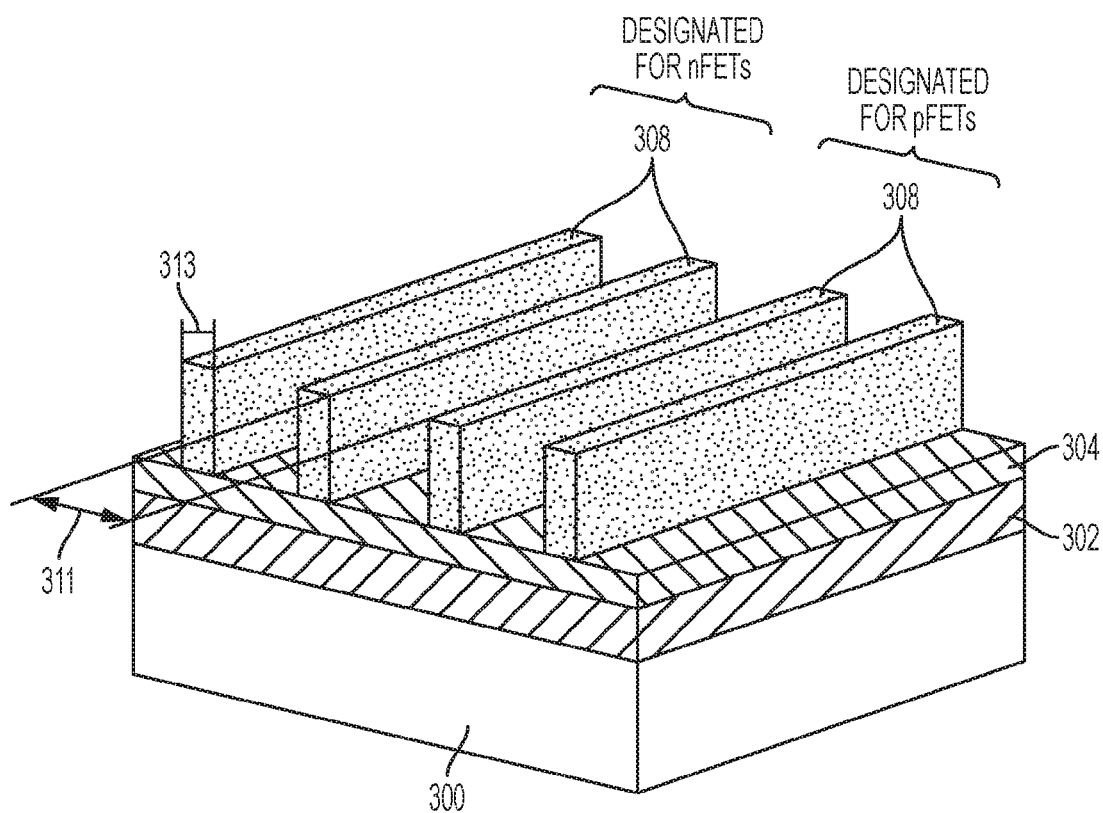
FIG. 3B illustrates removing the sacrificial layers to leave free standing spacers.

In FIG. 3B, the sacrificial layers 306 are removed to leave the free standing spacers 308. The area of the four free standing spacers 308 defines the fin regime. The two left spacers 308 are designated for building NFETs, and the two right spacers are designated for building PFETs. The location of the spacers 308 determines the position of the future fins. The spacers 308 are (simultaneously formed) for both the PFETs and NFETs. The dimensions (height and width) of the spacers 308 can be the same for both the fins of the PFETs and NFETs.

The spacer width 313 of each spacer 308 is substantially equal. The spacer width 313 may include a range of 6-10 nm. The pitch 311 between each of the spacers is substantially equal. The pitch 311 may be, e.g., 21 nm-32 nm.

Figure 3C:
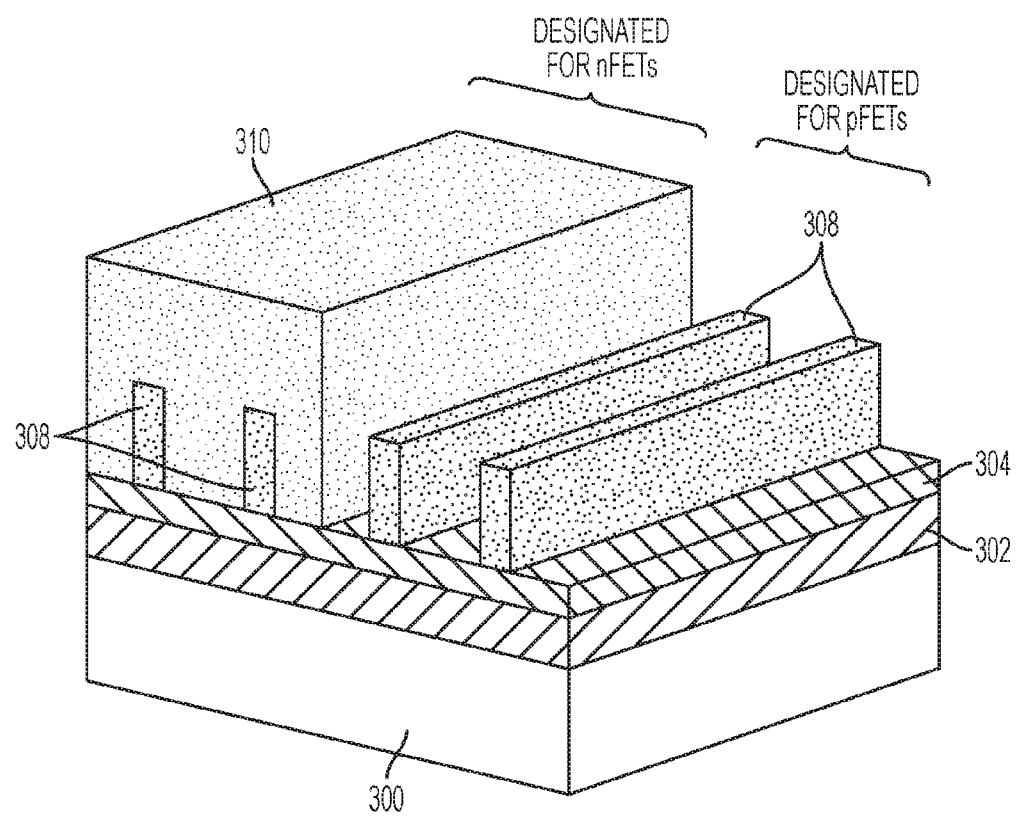
FIG. 3C illustrates that a mask is deposited over the area designated for the NFETs.

FIG. 3C illustrates that a mask 310 is deposited over the two left spacers 308 (designated for the NFETs) and deposited over a left portion of the fin hardmask 304 in order to protect the two left spacers 308 and the left portion of the fin hardmask 304. Moreover, the mask 310 protects the area designated for the NFETs before etching occurs to prepare fins for the PFETs.

Figure 3D:
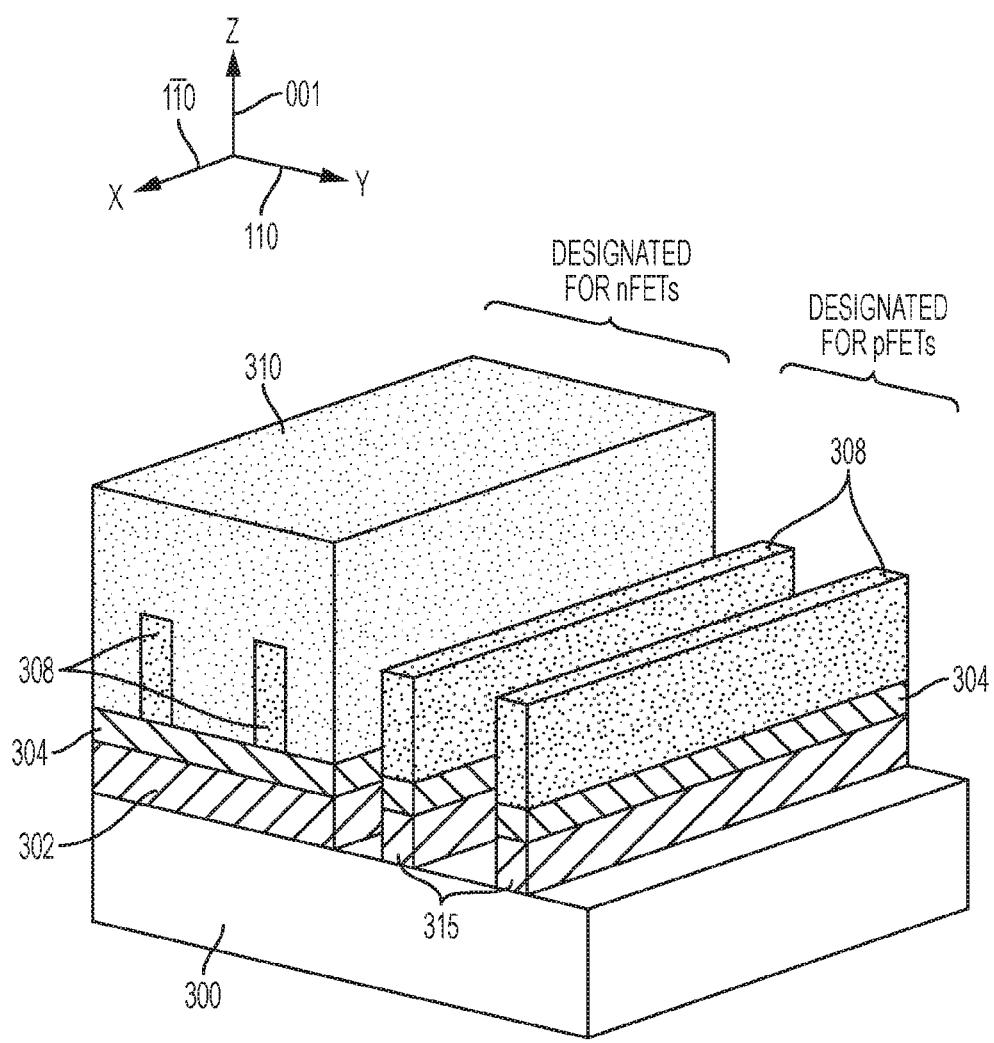
FIG. 3D illustrates etching to obtain vertical fin sidewalls, while the designated NFET area remains protected.

FIG. 3D illustrates etching, such as reactive ion etching ME, to remove both the fin hardmask 304 and fin material 302 that are not immediately under the two right spacers 308. The etching in the designated PFET area forms straight fin side walls (110) planes for PFETs, while the designated NFET area remains protected. The etching, which may be dry etching, and time are tuned to obtain two vertical profile fins 315. For example, after the etching reaches its end point (e.g. stop on substrate 300), over-etch time and angle can be tuned to obtain vertical fins.

Figure 3E:
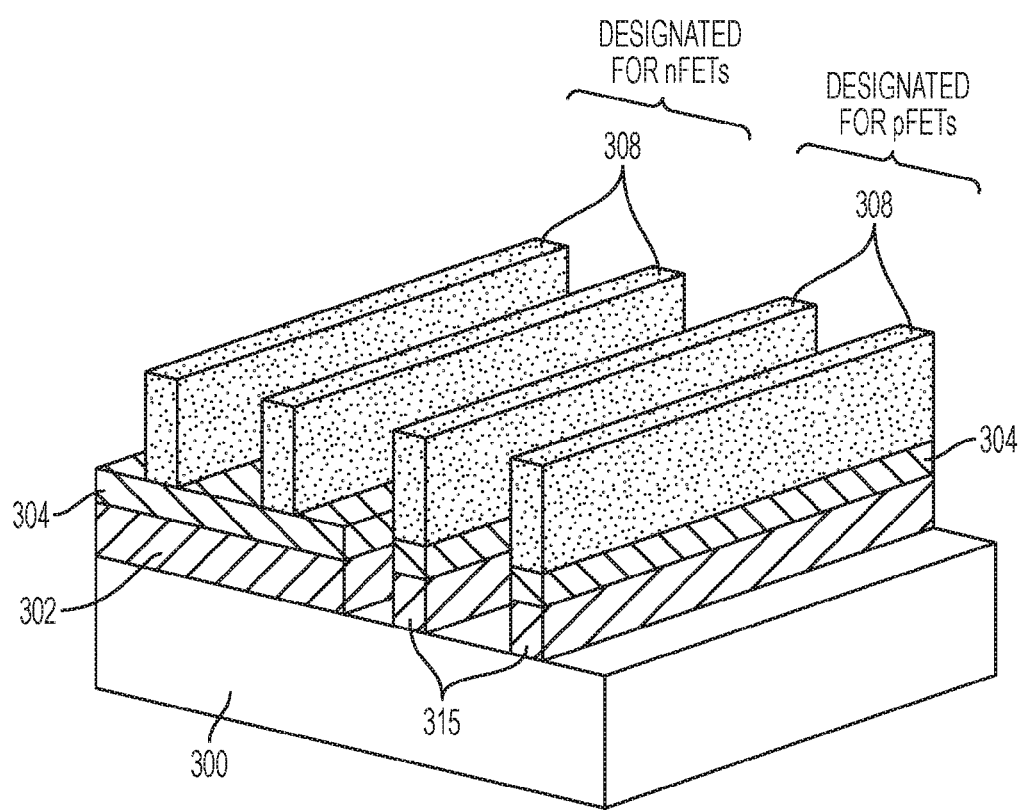
FIG. 3E illustrates removing the mask from the designated NFET area.
Figure 3F:
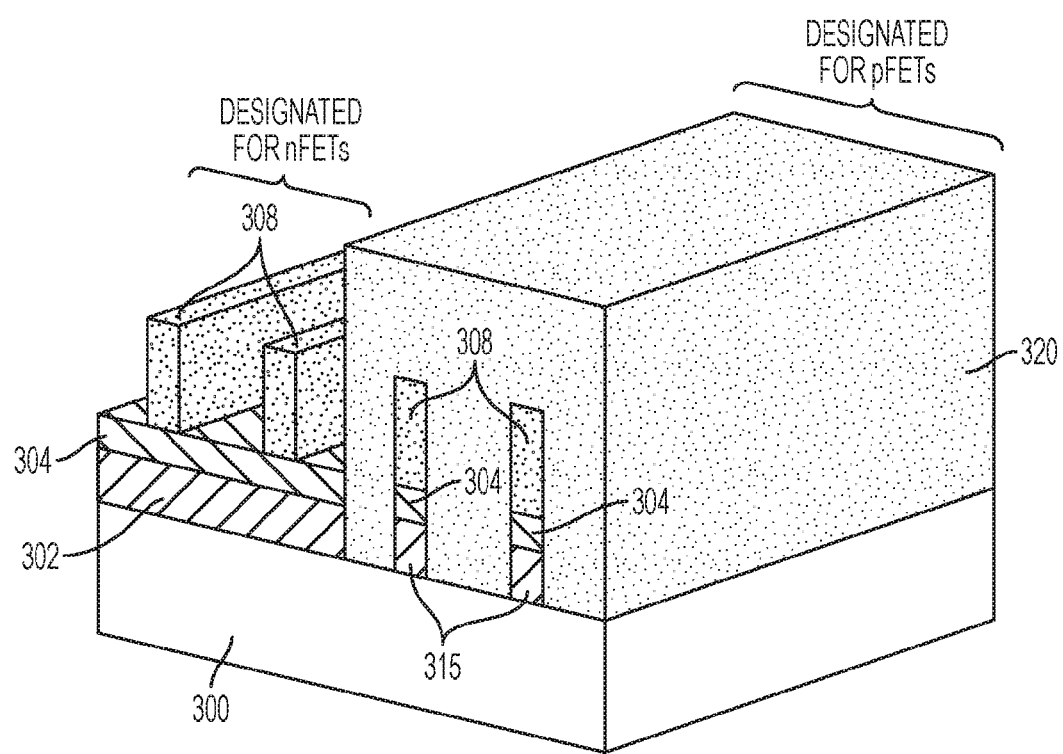
FIG. 3F illustrates depositing a mask over the area designated for PFETs.

In FIG. 3E, the mask 310 is removed, e.g., by dry etching. FIG. 3F illustrates that a mask 320 is deposited over the two right spacers 308 and over the hardmask 304 in the designated PFET area, in order to protect the two right spacers 308 and the right portion of the fin hardmask 304. In this case, the mask 320 protects the area designated for the PFETs before etching occurs to prepare fins for the NFETs. The masks 310 and 320 may be an oxide.

Figure 3G:
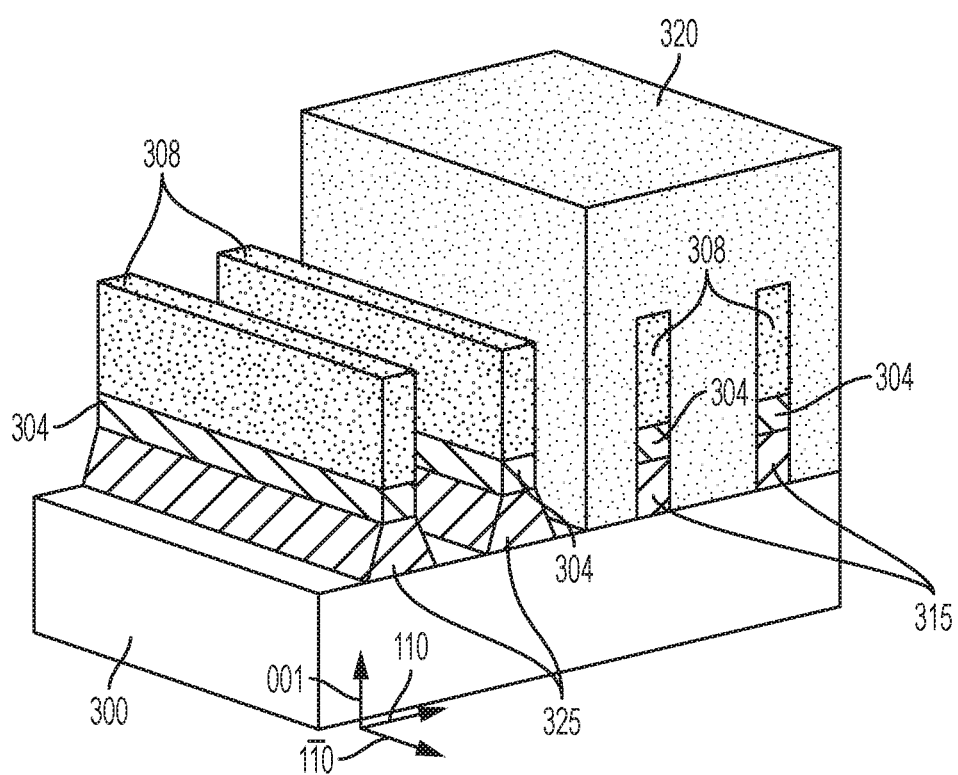
FIG. 3G illustrates etching to obtain tapered fin sidewalls, while the designated PFET area remains protected.

FIG. 3G illustrates etching (e.g., ME) to obtain tapered fin sidewalls approaching (100) plane for two tapered fins 325. The etching (e.g., dry etching) and time are tuned to obtain the two tapered fins 325. The tapered fins 325 are formed in a trapezoidal shape, and the base at the bottom of the trapezoid is wider than the width at the top of the trapezoid. For example, after the etching reaches its end point (e.g., stop on substrate 300), reduction in over-etch time can be tuned to obtain tapered fins.

Figure 3H:
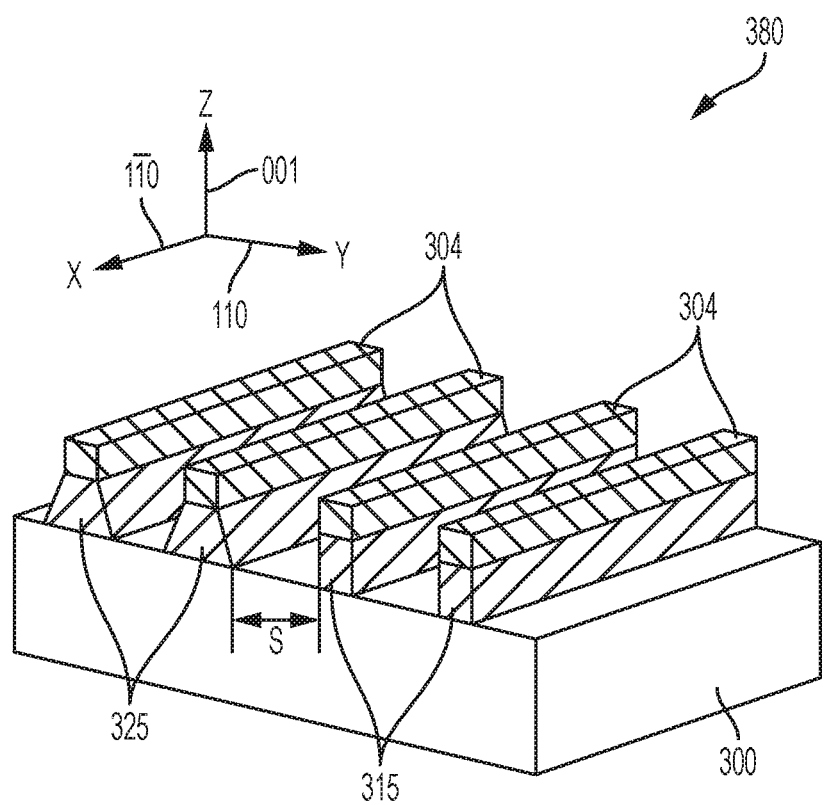
FIG. 3H illustrates removing the mask from the designated PFET area.

FIG. 3H illustrates that the mask 320 is removed from the designated PFET area. The fin hardmask 304 is removed from on top the tapered fins 325 and the vertical fins 315. The tapered fins 325 and vertical fins 315 can be formed in close proximity and still be respectively optimized for electron mobility (NFETs) and hole mobility (PFETs), during/sharing the same deposition process for the fin material 302 and fin hardmask 304. The spacing "s" between the tapered fin 325 and vertical fin 315 may be approximately 18-30 nm.

Figure 3I:
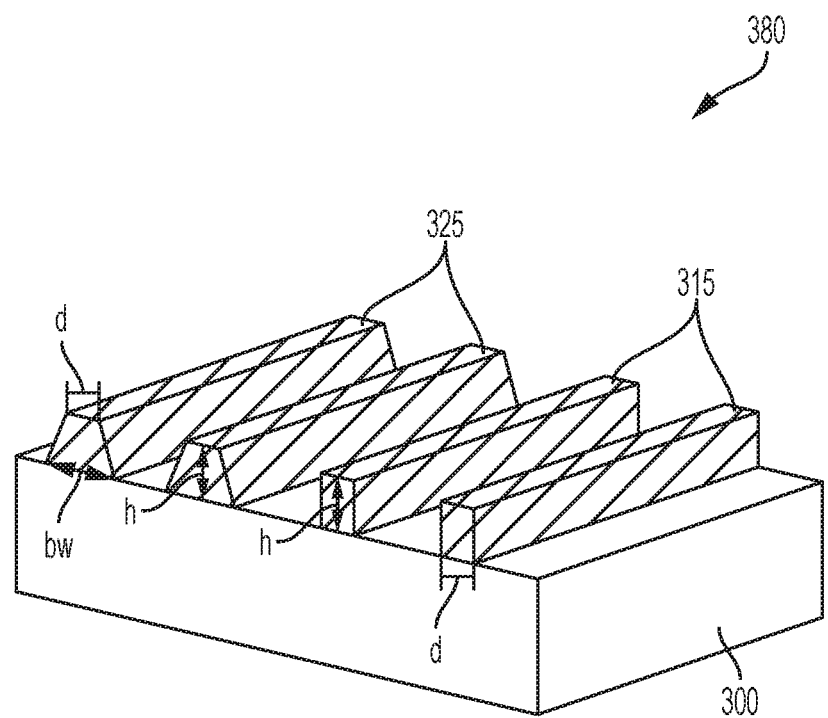
FIG. 3I illustrates removing the fin hardmask from on top of the vertical fins and the tapered fins.

FIG. 3I illustrates that fin hardmask 304 is removed from on top of the vertical fins 315 and the tapered fins 325. In FIG. 3I, a dual fin structure 380 has both the tapered fins 325 fabricated with enhanced electron mobility for NFETs and the vertical fins 315 fabricated with enhanced hole mobility. The vertical fins 315 and the tapered fins 325 both have a height "h". The top of the tapered fins 325 have the same width "d" as the vertical fins 315. However, the base of the tapered fins 325 has the wider base width "bw". The top width "d" may be about 5 or 6 nanometers (nm). The base width "bw" may be about 11 or 12 nm. Further, the base width "bw" is designed to be about twice as much as the top width "d", such that the electron mobility is improved along the tapered plane (shown as tapered sidewall 420 in FIG. 4). The height "h" may be about 30-45 nm, or as desired for the intended application.

Even though the spacer width 313 may be equal (or nearly equal) for each spacer 308 and the spacer pitch 311 is equal (or nearly equal) between each spacer 308 (shown in FIG. 3B), the fabrication process is configured to optimize electron mobility in the tapered fins 325 and optimize hole mobility in the vertical fins 315 (both of which are on the same microprocessor).

Figure 3J:
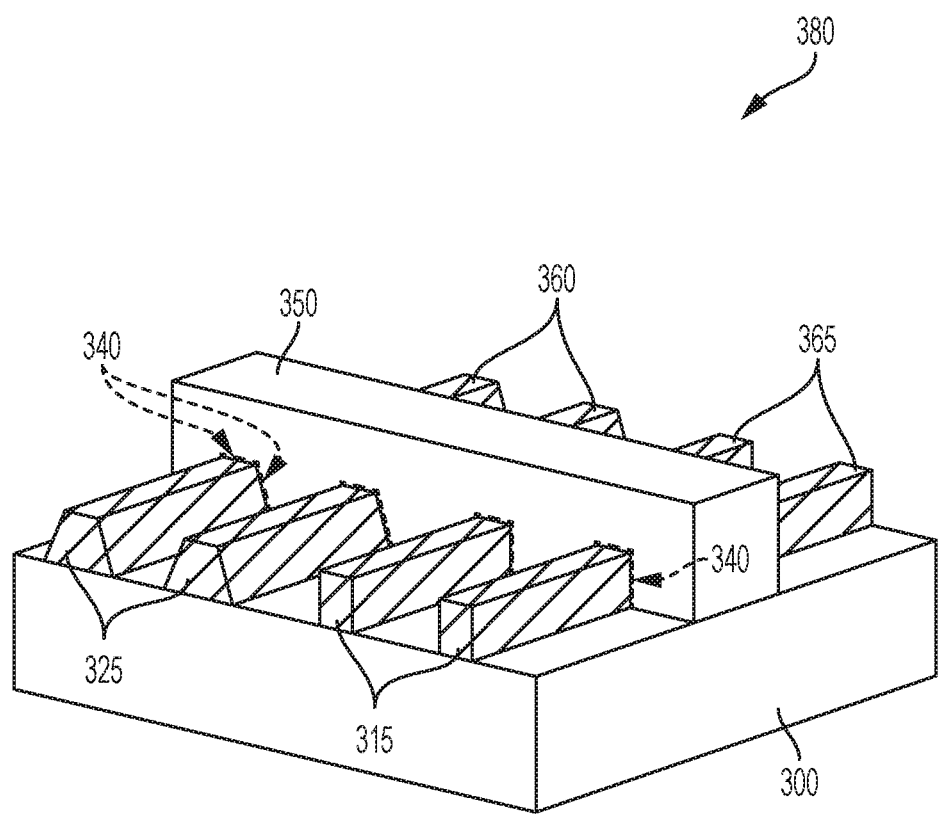
FIG. 3J illustrates depositing a gate oxide and gate over both the vertical fins and tapered fins.

FIG. 3J illustrates a gate stack including a gate oxide layer 340 and a gate electrode layer 350 deposited over both the vertical fins 315 and the tapered fins 325, thus forming the two NFETs 360 and the two PFETs 365. The gate electrode layer 350 and gate oxide layer 340 (underneath the gate electrode layer 350) are etched to form the structure 380 shown in FIG. 3J (using any technique known to one skilled in the art). The gate oxide layer 340 is wrapped around (the tops and sides) the tapered fins 325 and vertical profile fins 315, and the gate electrode layer 350 is on top of the gate oxide layer 340 as understood by one skilled in the art, such that the NFETs 360 and PFETs 365 are formed. The gate material of the gate electrode layer 350 may include silicon, germanium, metals, metal alloys, and a combination thereof, which are doped with dopants to conduct electricity. The gate oxide layer 340 may be a high-K dielectric, such as a thin layer of hafnium oxide, for example.

Although FIGS. 3A through 3J show building the vertical profile fins 315 for PFETs before forming the tapered (trapezoidal) fins 325 for NFETs, embodiments are not meant to be limited to this order. In one embodiment, the tapered (trapezoidal) fins 325 for NFETs can be formed before the vertical profile fins 315 for PFETs.

Figure 4:
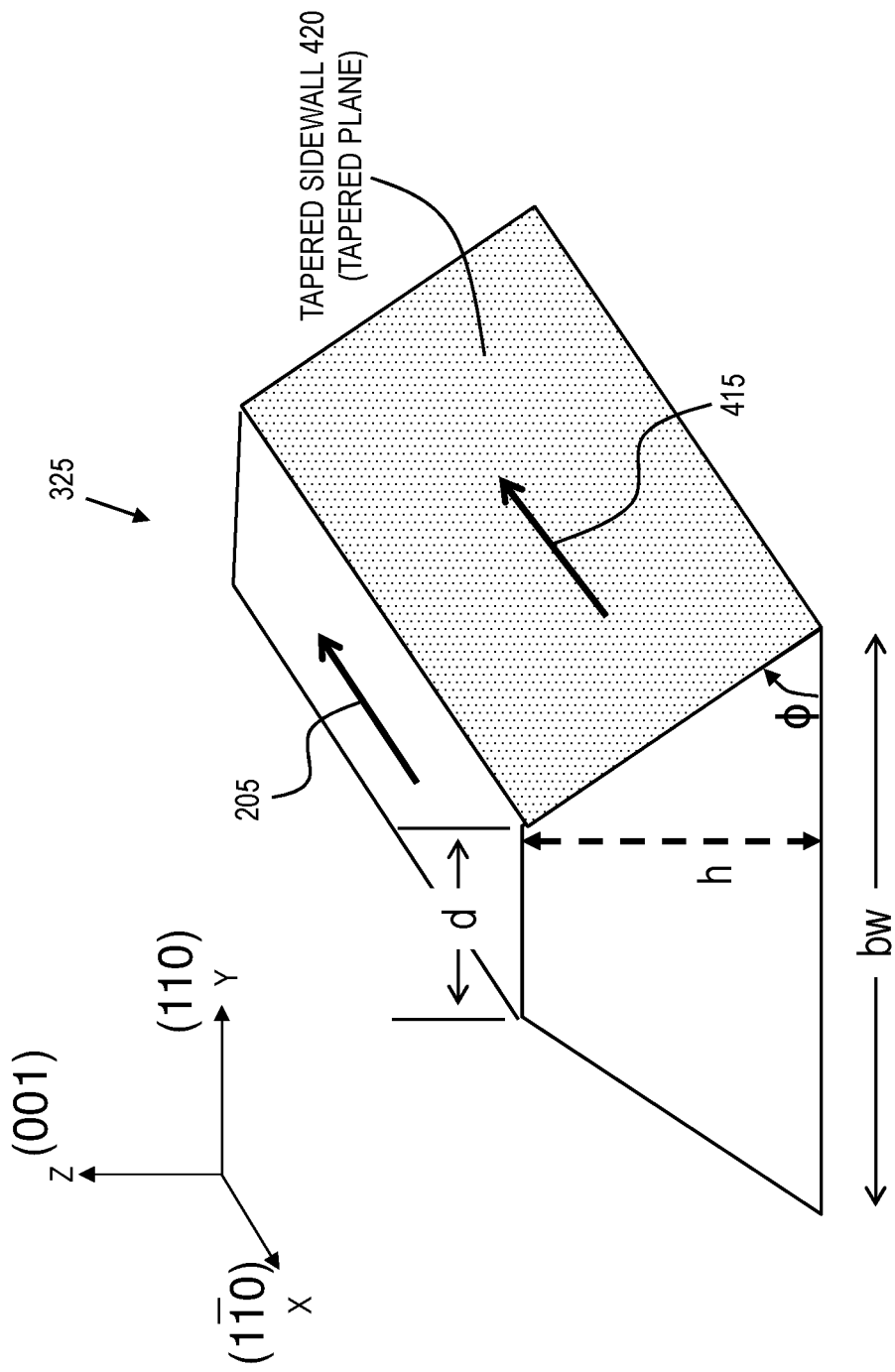
FIG. 4 illustrates further details of the tapered fin according to an embodiment.

FIG. 4 illustrates further details of the tapered fin 325 according to an embodiment. As discussed in FIG. 2, the electron mobility is highest in the (100) plane (x-y plane), which corresponds to electrical current 205. The tapered fin 325 has a tapered sidewall 420 that has been optimized to increase electron mobility better that the vertical sidewall in the vertical fin 315 and better than the angled foot in FIG. 2. The flatter (i.e., more horizontal) the tapered sidewall 420, the better the electron mobility is in the electrical current 415. As the top width "d" and the height "h" remain constant, the base width "bw" can be increased to correspondingly increase the electron mobility (which decreases the angle φ). Accordingly, the base width "bw" should be about twice the length of the top width "d".

Referring back to FIGS. 3I and 3J, the dual fin structure 380 is optimized with tapered fins 325 for NFETs and vertical fins 315 for PFETs on the same structure (circuit). The dual fin structure 308 may be a microprocessor. In one example, the dual fin structure 308 can be static random-access memory (SRAM) which is a building block/circuit in a semiconductor microprocessor. The dual fin structure 308 may be utilized in the same circuit to form various logic circuits, such as "AND" circuits, "OR" circuits, and "NOT" circuits. For example, the dual fin structure 308 may be utilized as an inverter circuit.

Now turning to FIGS. 5A and 5B, a method 500 of forming a semiconductor device (with dual fin integration for electron and hole mobility enhancement) is provided according to an embodiment. Reference can be made to FIGS. 1-4, 6, and 7 discussed herein.

At block 505, a plurality of sacrificial mandrels 306 are formed over the hardmask layer 304, where the hardmask layer 304 is disposed over a semiconductor layer 302, as shown in FIG. 3A.

At block 510, plurality of spacers 308 are formed on sidewalls of the sacrificial mandrels 306, as shown in FIG. 3A. At block 515, the sacrificial mandrels 306 are removed to leave the plurality of spacers 308 as shown in FIG. 3B.

At block 520, a masking process is performed to leave exposed a first set of the plurality of spacers 308 with a second set of the plurality of spacers 308 protected as shown in FIG. 3C. At block 525, a first fin etch process is performed to form a first set of fins (e.g., vertical profile fins 315) in the semiconductor layer 302 using the first set of spacers 308 (e.g., the right set of spacers 308), such that the first set of fins 315 has a vertical sidewall profile, as shown in FIGS. 3D and 3E.

At block 530, another masking process is performed to leave exposed the second set of spacers 308 (e.g., the left set of spacers 308) while protecting the first set of spacers 308 and the first set of fins 315, as shown in FIG. 3F. At block 535, a second fin etch process is performed to form a second set of fins (e.g., trapezoidal/tapered fins 325) in the semiconductor layer 302 using the second set of spacers 308, such that the second set of fins 325 has a trapezoidal sidewall profile as shown in FIG. 3G.

During the masking process a first mask 310 covers the second set of the plurality of spacers 308, and the first mask may be an oxide.

During the other masking process a second mask 320 covers the first set of the plurality of spacers 308, and the second mask may be an oxide.

The plurality of spacers 308 includes at least one of an oxide and a nitride. The semiconductor layer 302 comprises at least one of silicon and germanium. The first set of fins 315 comprises positive channel field effect transistors (PFET) devices, and the second set of fins 325 comprises negative channel field effect transistors (NFET) devices, as shown in FIG. 3J. A gate electrode 350 is formed over the first set of fins 315 and the second set of fins 325.

A base width ("bw") of the second set of fins 325 is at least twice a length of a top width of the second set of fins 325 (reference can be made to FIG. 4). A height ("h") of the second set of fins 325 is about equal to a height ("h") of the first set of fins 315. The trapezoidal shaped fins 325 have a larger base ("bw") than the base ("d") of the vertical shaped fins.

An integrated circuit includes the first set of fins 315 and the second set of fins 325. An individual microprocessor (e.g., structure 380) includes the integrated circuit having the first set of fins 315 and the second set of fins 325, such that the first set of fins comprises PFET devices 365 and the second set of fins comprises NFET devices 360.

By having both the trapezoidal shaped fins 325 and the vertical shaped fins 315 on the same microprocessor (e.g., the dual fin structure 380 is a semiconductor microprocessor (i.e., chip)) increases the speed of the microprocessor as compared to either only having the trapezoidal shaped fins or only having the vertical shaped fins. In the microprocessor dual fin structure 380, the electron current is optimized in the NFETs 360 because of the trapezoidal/tapered shaped fins 325, and concurrently, the hole current is optimized in the PFETs 365 because of the vertical shaped fins 315.

FIG. 6 illustrates a method 600 of forming a semiconductor device dual fin integration for electron and hole mobility enhancement according to an embodiment. Reference can be made to FIGS. 1-5, and 7.

At block 605, negative channel field effect transistors (NFETs) 360 are provided, in which the NFETs 360 have trapezoidal shaped fins 325 for a source and a drain. The source is on one side of the gate 350 while the drain is across the gate 350 on the opposite side of the trapezoidal shaped fin 325.

At block 610, positive channel field effect transistors (PFETs) are provided, in which the PFETs have vertical shaped fins 315.

At block 615, the trapezoidal shaped fins have a larger base (base width "bw") that the vertical shaped fins, and the trapezoidal shaped fins and the vertical shaped fins are together on the same substrate 300 in a microprocessor (e.g., in the dual fin structure 380).

The base width "bw" of the trapezoidal fins 325 is about twice the length of the top width "d" of the trapezoidal fins 325. The height "h" of the trapezoidal fins 325 is about equal to the height of the vertical shaped fins 315.

Figure 7:
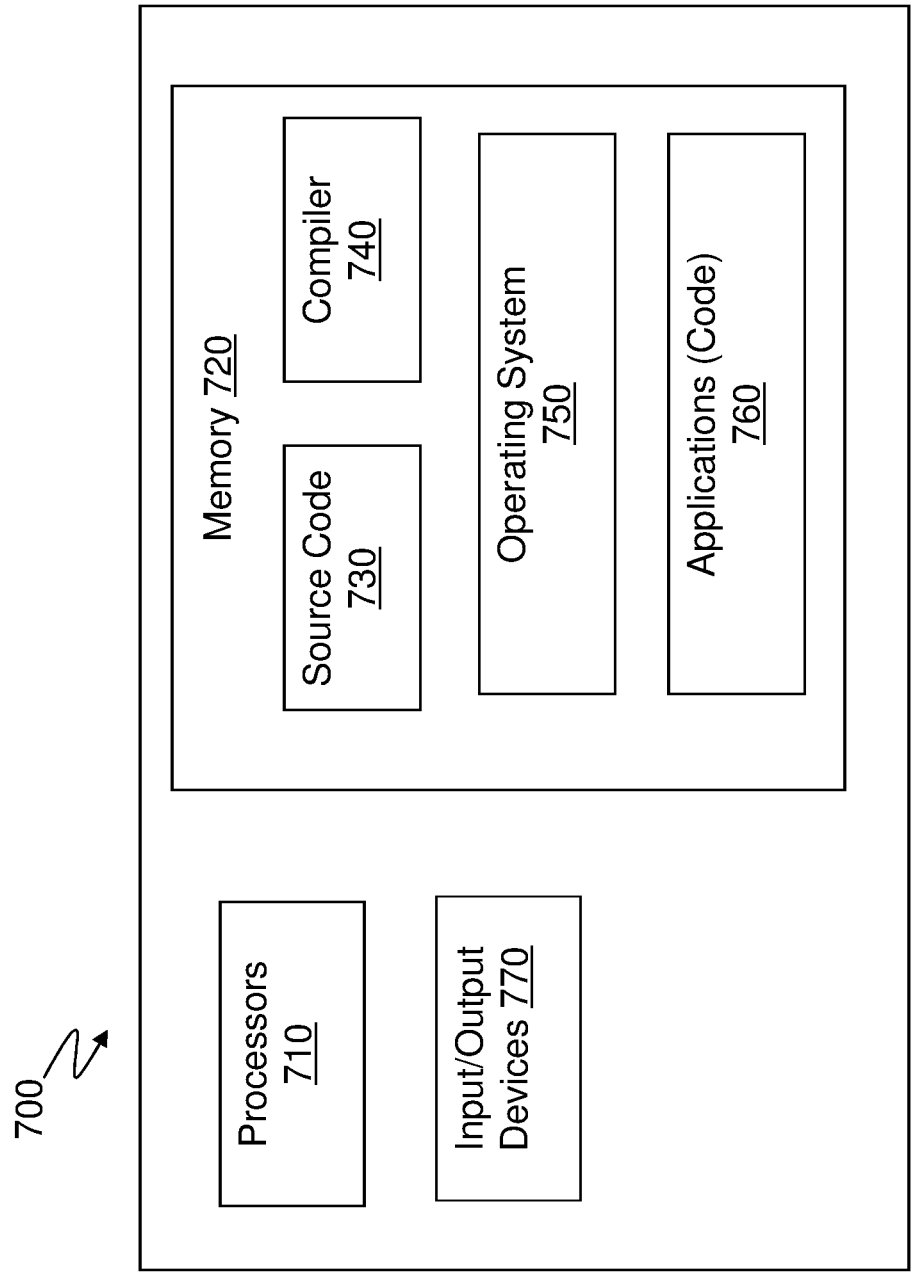
FIG. 7 illustrates an example of a computer having capabilities, which may be included and utilized in embodiments.

FIG. 7 illustrates an example of a computer 700 having capabilities, which may be included in exemplary embodiments. Various methods, procedures, modules, flow diagrams, tools, applications, circuits, elements, and techniques discussed herein may also incorporate and/or utilize the capabilities of the computer 700. Moreover, capabilities of the computer 700 may be utilized to implement features of exemplary embodiments discussed herein. One or more of the capabilities of the computer 700 may be utilized to implement, incorporate, to connect to, and/or to support any element discussed herein (as understood by one skilled in the art) in FIGS. 1-6.

Generally, in terms of hardware architecture, the computer 700 may include one or more processors 710, computer readable storage memory 720, and one or more input and/or output (I/O) devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a data signal processor (DSP), or an auxiliary processor among several processors associated with the computer 700, and the processor 710 may be a semiconductor based microprocessor (in the form of a microchip) or a microprocessor. Note that the memory 720 can have a distributed architecture, where various components are situated remote from one another, but can be accessed by the processor 710.

The software in the computer readable memory 720 may include one or more separate programs, each of which comprises an ordered listing of executable instructions for implementing logical functions. The software in the memory 720 includes a suitable operating system (O/S) 750 and one or more applications 760 of the exemplary embodiments. As illustrated, the application 760 comprises numerous functional components for implementing the features, processes, methods, functions, and operations of the exemplary embodiments. The application 760 of the computer 700 may represent numerous applications, agents, software components, modules, interfaces, controllers, etc., as discussed herein but the application 760 is not meant to be a limitation.

The operating system 750 may control the execution of other computer programs, and provides scheduling, input-output control, file and data management, memory management, and communication control and related services.

The application 760 may be a source program, executable program (object code), script, or any other entity comprising a set of instructions to be performed. When a source program, then the program is usually translated via a compiler, assembler, interpreter, or the like, which may or may not be included within the memory 720, so as to operate properly in connection with the O/S 750. Furthermore, the application 760 can be written as (a) an object oriented programming language, which has classes of data and methods, or (b) a procedure programming language, which has routines, subroutines, and/or functions.

The I/O devices 770 may include input devices (or peripherals) such as, for example but not limited to, a mouse, keyboard, scanner, microphone, camera, etc. Furthermore, the I/O devices 770 may also include output devices (or peripherals), for example but not limited to, a printer, display, etc. Finally, the I/O devices 770 may further include devices that communicate both inputs and outputs, for instance but not limited to, a MC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or an intranet. The I/O devices 770 may be connected to and/or communicate with the processor 710 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

When the application 760 is implemented in software it should be noted that the application 760 can be stored on virtually any computer readable storage medium for use by or in connection with any computer related system or method.

The application 760 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 760 is implemented in hardware, the application 760 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 700 includes non-limiting examples of software and hardware components that may be included in various devices, servers, and systems discussed herein, and it is understood that additional software and hardware components may be included in the various devices and systems discussed in exemplary embodiments.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A semiconductor device comprising:
   trapezoidal shaped fins formed on a substrate, wherein a trapezoidal shape of the trapezoidal shaped fins enhances electron mobility; and
   vertical shaped fins formed on the substrate, wherein a straight vertical shape of the vertical shaped fins enhances hole mobility, wherein the trapezoidal shaped fins have a larger base that the vertical shaped fins;
   wherein the trapezoidal shaped fins and the vertical shaped fins are formed together as components in an integrated circuit.

2. The semiconductor device of claim 1, wherein the integrated circuit having both the trapezoidal shaped fins and the vertical shaped fins is a microprocessor.

* * * * *